United States Patent [19] [11] Patent Number: 6,063,661
Cheng et al. [45] Date of Patent: *May 16, 2000

[54] METHOD FOR FORMING A BOTTOM POLYSILICON ELECTRODE OF A STACKED CAPACITOR FOR DRAM

[75] Inventors: Huang-Chung Cheng; Huan-Ping Su; Han-Wen Liu, all of Hsinchu, Taiwan

[73] Assignee: National Science Council, Taipei, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 08/603,643

[22] Filed: Feb. 20, 1996

[51] Int. Cl.⁷ .................................................. H01L 21/8242
[52] U.S. Cl. ............................................ 438/255; 498/398
[58] Field of Search .............................. 437/47, 48, 52, 437/60, 919; 438/238, 239, 253–255, 381, 396–398

[56] References Cited

U.S. PATENT DOCUMENTS 5,266,514  11/1993  Tuan et al. ................................. 437/52
5,286,668   2/1994  Chou ........................................ 437/52
5,597,755   1/1997  Ajika et al. ............................... 437/52

OTHER PUBLICATIONS

H. Watanabe et al., "Device application and structure observation for hemispherical–grained Si," *J. Appl. Phys.* 71(7), Apr. 1, 1992, pp. 3538–3543.
M. Yoshimaru et al., "Rugged surface poly–Si electrode and low temperature deposited $Si_3N_4$ for 64Mbit and beyond STC DRAM cell," 1990 IEEE IEDM, pp. 659–662.
H. Watanabe et al., "A new cylindrical capacitor using hemispherical grained Si (HSG–Si) for 256Mb DRAMs," 1992 IEEE IEDM, pp. 259–262.
H. Watanabe et al., "A novel capacitor with porous–Si electrodes for high density DRAMs," Symposium on VLSI Technology, 1993, pp. 17–18.

*Primary Examiner*—Joni Chang
*Attorney, Agent, or Firm*—Hitt Chwang & Gaines, P.C.

[57] ABSTRACT

A method for forming a bottom polysilicon electrode of a stacked capacitor for DRAMs makes use of a double-layered polysilicon structure and a phosphoric acid etching. When the double-layered polysilicon structure is etched with the phosphoric acid, the polysilicon grain boundary is etched at a rate faster than the polysilicon grain itself so as to enable the formation of a rugged surface and thus increases the total surface area.

10 Claims, 7 Drawing Sheets

METHOD FOR FORMING A BOTTOM POLYSILICON ELECTRODE OF A STACKED CAPACITOR FOR DRAM

FIELD OF THE INVENTION

The present invention relates generally to a dynamic random access memory (DRAM), and more particularly to a method for forming a bottom polysilicon electrode of a stacked capacitor for use in DRAMs.

BACKGROUND OF THE INVENTION

As the density of semiconductor elements is intensified, the cell size of DRAMs is made smaller, thereby resulting in a reduction in capacitance of a stacked capacitor of the DRAMs. The remedial measures for increasing the capacitance of the stacked capacitor involve a reduction in the thickness of the dielectric layer or a change in the ingredients of which the dielectric layer is made. The focus of the recent development in the field is a method by which the electrode surface area is increased by taking advantage of the three-dimensional structure, as exemplified by a research which was done and published by H. Watanabe, et. al. in J. APPL. PHYS. 71 (7), Apr. 1, 1992, pp. 3538–3543, and by another research which was done and published by M. Yoshimaru, et al., in 1990 IEEE IEDM, pp. 659–662. The methods involve forming a polysilicon film having an appropriate thickness with an appropriate deposition rate at a temperature ranging between 560 and 600° C. by low-pressure chemical vapor deposition (LPCVD), whereby the polysilicon film so formed has a hemispherical grained (HSG) surface and thus increasing the polysilicon electrode surface area. The polysilicon electrode may be columnar in shape, as disclosed in a research report by H. Watanabe, et al. in 1992 IEEE IEDM, pp. 259–262. Another report, which was published by H. Watanabe, et al. in SYMPOSIUM ON VLSI TECHNOLOGY, 1993, pp. 17–18, discloses a process for forming a porous polysilicon layer and a surface having micro cavities by impregnating a phosphorus-doped polysilicon in phosphoric acid at a temperature of 150° C. It was pointed out by H. Watanabe, et al. in the report that the grain boundaries of the polysilicon film, which contains a high concentration of phosphorus, are severely etched by the phosphoric acid treatment at a high temperature. A further research, which was carried out by us, shows that the film surface is provided with trenches in addition to the micro cavities after a phosphorus-doped polysilicon is treated at 120° C. by the phosphoric acid, wherein said phosphorus-doped polysilicon is doped by means of an ion implantation or $POCl_3$ diffusion and then activated by means of a high temperature activation. The film surface so formed is shown by scanning electron microscope (SEM) photograph in FIG. 1. The entire film surface is provided with a number of islands. Now referring to FIG. 2, a top-view micrograph of the film surface, which was taken by a transmission electron microscope (TEM), reveals that the silicon grains of the polysilicon are similar in size and form to the islands of the film surface, thereby confirming our belief that the etching was done by the phosphoric acid along the grain boundaries. FIG. 3 shows the measured sheet resistance values of the polysilicon films having various doped concentrations which were treated with the phosphoric acid for various duration. It is clearly shown that the increments in sheet resistance values are in a direct proportion to the lengths of the etching duration, especially in situations in which the phosphorus-doping concentrations are high. In the case where the phosphorus-doping concentration is $6E15/cm^2$, an open-circuit takes place when the duration of the phosphoric acid treatment exceeds 60 minutes. We believe that the open-circuit phenomenon is the consequence of a fact that the grain boundaries of the polysilicon are totally etched, which has a detrimental effect on the production of DRAMs.

SUMMARY OF THE INVENTION

The primary objective of the present invention is to provide a method capable of overcoming the production problem described above. The method of the present invention makes use of a double-layered polysilicon structure.

According to the method of the present invention, the stacked capacitor is formed on a silicon substrate and provided with a silicon dioxide layer, a bottom polysilicon electrode, a dielectric layer, and a top polysilicon electrode.

The method of the present invention comprises the following steps of:

(a) forming by deposition a first polysilicon layer on the silicon dioxide layer;

(b) doping impurity ions into said first polysilicon layer such that said first polysilicon layer becomes a doped first polysilicon layer;

(c) activating said impurity ions doped into said first polysilicon layer such that said doped first polysilicon layer becomes an activated and doped first polysilicon layer;

(d) forming by deposition a second polysilicon layer on said activated and doped first polysilicon layer;

(e) doping impurity ions into said second polysilicon layer such that said second polysilicon layer becomes a doped second polysilicon layer;

(f) activating said impurity ions doped into said second polysilicon layer such that said doped second polysilicon layer becomes an activated and doped second polysilicon layer; and (g) forming a bottom silicon electrode having a rugged surface by etching with the phosphoric acid the activated and doped second polysilicon layer.

Preferably, the first polysilicon layer is formed by the low-pressure chemical vapor deposition and has a thickness ranging between 500 and 2000 Å.

Preferably, the second polysilicon layer is formed by the low-pressure chemical vapor deposition and has a thickness ranging between 500 and 2000 Å.

Preferably, said doping impurity ions into said first polysilicon layer referred to in the step (b) and said activating said impurity ions doped into said first polysilicon layer referred to in the step (c) are carried out simultaneously by a phosphorus oxychloride ($POCl_3$) diffusion.

Preferably, said doping impurity ions into said second polysilicon layer referred to in the step (e) and said activating said impurity ions doped into said second polysilicon layer referred to in the step (f) are carried out simultaneously by a phosphorus oxychloride ($POCl_3$) diffusion.

Alternatively, said doping impurity ions into the first polysilicon layer in the step (b) and said doping impurity ions into the second polysilicon layer in the step (e) are done by ion implantation. The ion selected from the group consisting of $P^+$, $As^+$, $Sb^+$, $BF_2^+$ and $B^+$, is suitable for use as a source of ions for the ion implantation. Said activating said impurity ions doped into said first polysilicon layer referred to in the step (c) and said activating said impurity ions doped into said second polysilicon layer referred to in the step (f) can be activated respectively by a rapid thermal annealing (RTA), a conventional furnace annealing (CFA), or a combination of said rapid thermal annealing (RTA) and said conventional furnace annealing (CFA).

Preferably, the phosphoric acid etching referred to in the step (g) is carried out by a phosphoric acid solution containing 40–90 weight percent concentration of phosphoric acid at a temperature ranging between 60 and 160° C. for a period lasting between 3 and 250 minutes, preferably between 3 and 150 minutes, and between 3 and 30 minutes at best.

Upon completion of the step (a) through the step (f), it is believed that the grain boundaries of the first polysilicon layer and the second polysilicon layer are substantially kept apart. As a result, even if the grain boundaries of the second polysilicon layer are etched severely, the grain boundaries of the first polysilicon layer will remain substantially intact and thus an open-circuit will not take place in the entire bottom polysilicon electrode when the phosphoric acid etching is in progress in the step (g). Therefore, the method of the present invention is capable of bringing about an increase in the process window.

DESCRIPTION OF A COMPARING EMBODIMENT

Figure 1:
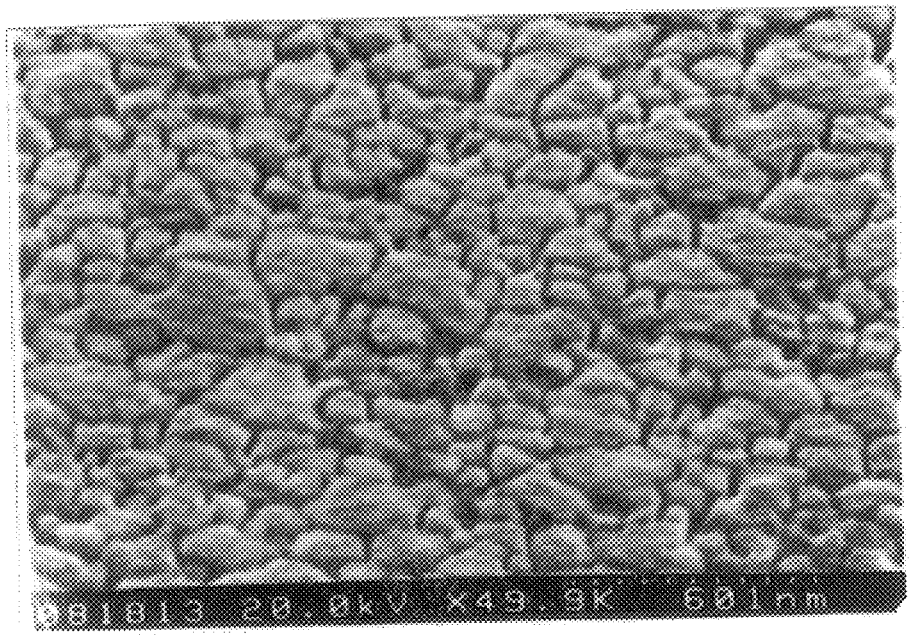
FIG. 1 is a scanning electron microscope (SEM) photograph showing the surface of the phosphorus-doped polysilicon film which was treated with the phosphoric acid at 120° C.
Figure 2:
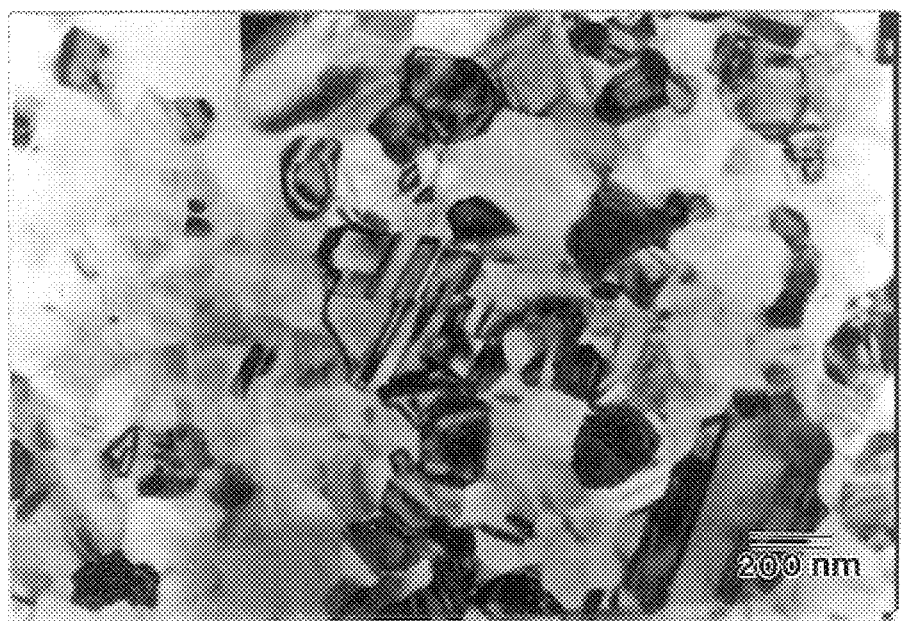
FIG. 2 is a top-view transmission electron microscope (TEM) photograph of the etched phosphorus-doped polysilicon film shown in FIG. 1.
Figure 3:
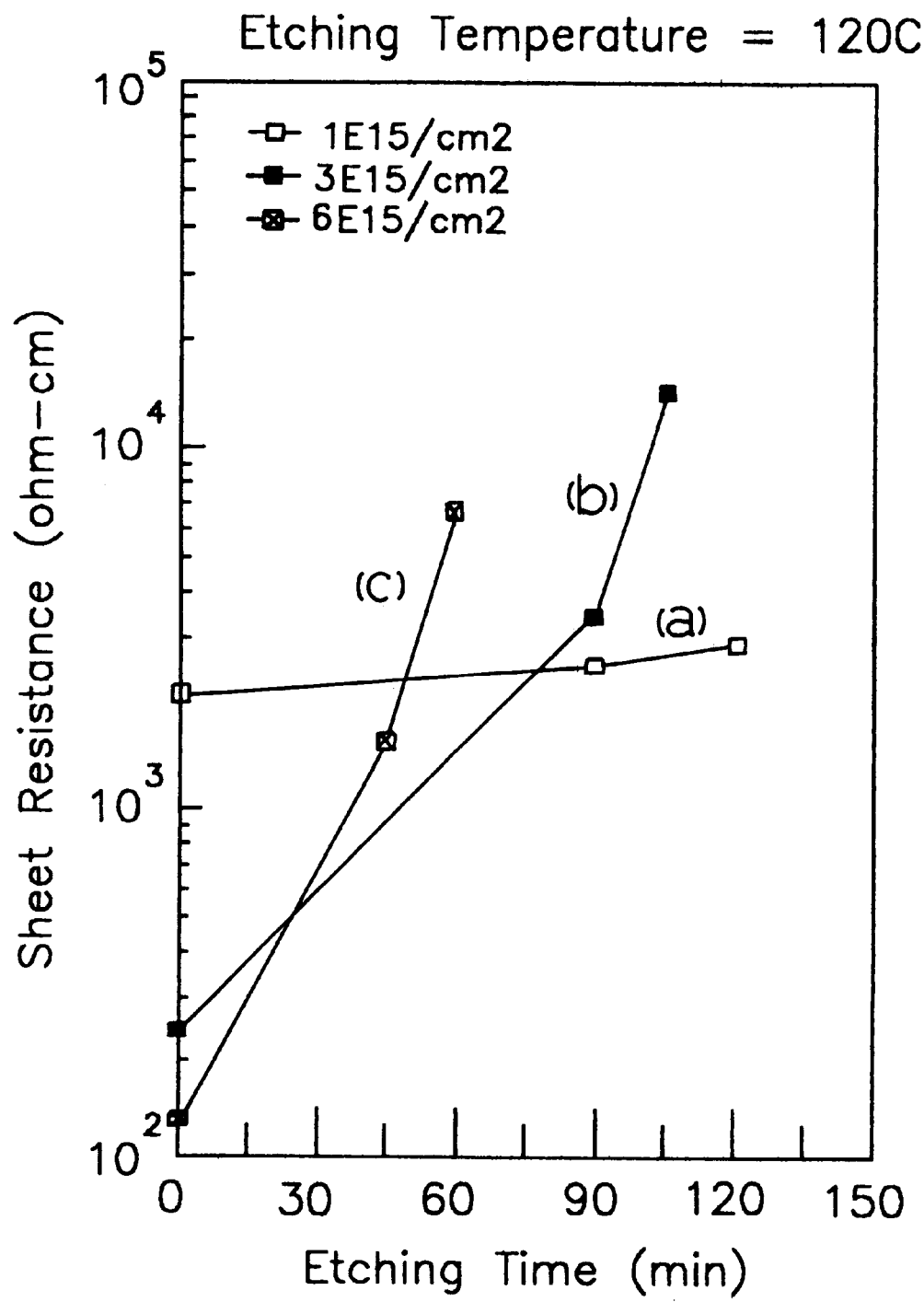
FIG. 3 is a plot showing the correlation between the sheet resistance values and the phosphoric acid etching time of the polysilicon films doped with various concentrations of (a): $1E15/cm^2$; (b) $3E15/cm^2$; and (c) $6E15/cm^2$.
Figure 4:
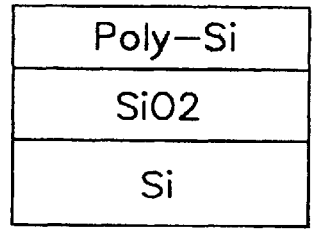
FIGS. 4($a$)–4($h$) are cross-sectional views illustrating a conventional process of preparing a stacked capacitor on a silicon substrate.
Figure 4:
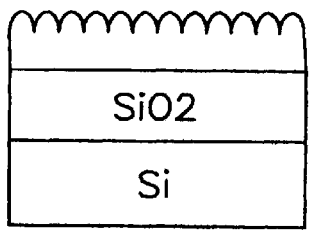
Figure 4:
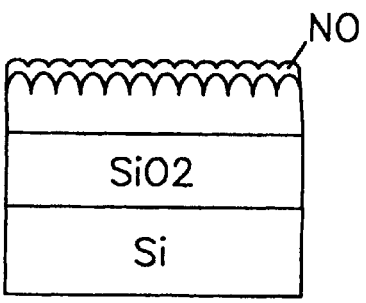
Figure 4:
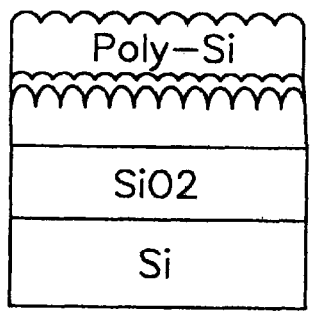
Figure 4:
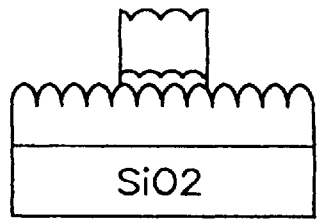
Figure 4:
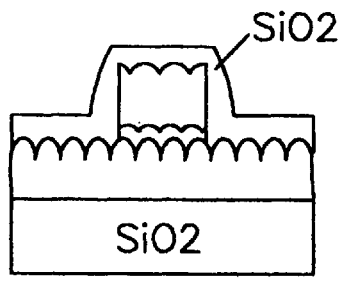
Figure 4:
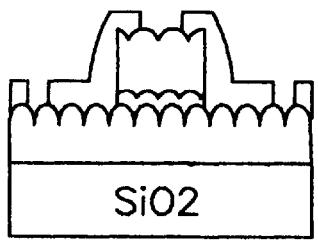
Figure 4:
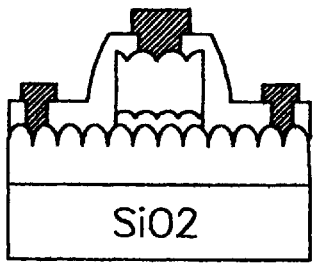

As illustrated in FIGS. 4($a$)–4($h$), the preparation of a stacked capacitor on a silicon substrate comprises several steps, which are described in series hereinafter.

By means of the low-pressure chemical vapor deposition, a bottom polysilicon layer having a thickness of 2000 Å is formed on the silicon dioxide layer of a silicon substrate, as shown in FIG. 4($a$). The bottom polysilicon is then doped and activated by the $POCl_3$ diffusion at 850° C. for 20 minutes.

The semifinished product of polysilicon/silicon dioxide/silicon substrate is immersed in a phosphoric acid solution containing 85% concentration of phosphoric acid at 140° C. for a predetermind period for the formation of the bottom polysilicon layer having a rugged surface, as shown in FIG. 4($b$).

A silicon nitride ($Si_3N_4$) layer having a thickness of 60 Å is formed by deposition on the bottom polysilicon layer having the rugged surface, which is then converted to a NO dielectric layer by moisture oxidation, as shown in FIG. 4($c$).

The steps used to form the bottom polysilicon layer illustrated in FIG. 4($a$) and to dope the phosphorus therein are repeated so as to form on the NO dielectric layer a top polysilicon layer which is doped with phosphorus and activated, as shown in FIG. 4($d$).

A top polysilicon electrode area is defined by photolithography before the top polysilicon layer and the dielectric layer located on all areas other than the top polysilicon electrode area are stripped by etching, as shown in FIG. 4($e$).

A silicon dioxide insulation layer is formed on all areas by deposition, as illustrated in FIG. 4($f$).

Contact holes are formed by photo-lithography in the silicon dioxide insulation layer, as shown in FIG. 4($g$).

Each of the contact holes is provided with an aluminum pad, as shown in FIG. 4($h$).

DESCRIPTION OF AN EMBODIMENT OF THE INVENTION

Figure 5:
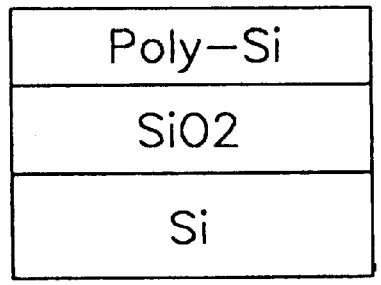
FIGS. 5(A)–5(C) are cross-sectional views illustrating a process of preparing a bottom polysilicon electrode of a stacked capacitor in accordance with the present invention.
Figure 5:
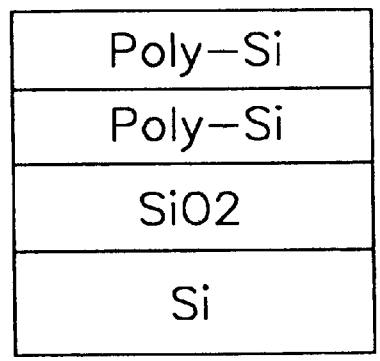
Figure 5:
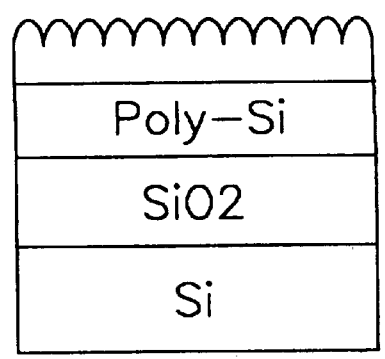

As illustrated in FIGS. 5(A)–5(C), a method of the present invention for preparing a bottom polysilicon electrode of a stacked capacitor comprises a series of steps, which are described explicitly hereinafter in series.

By means of the low-pressure chemical vapor deposition (LPCVD), a first polysilicon layer having a thickness of 1000 Å is formed on the silicon dioxide layer of a silicon substrate, as shown in FIG. 5(A). The first polysilicon layer is then doped by the $POCl_3$ diffusion at 850° C. for 10 minutes.

A second polysilicon layer having a thickness of 1000 Å is formed on the first polysilicon layer by the low-pressure chemical vapor deposition (LPCVD), shown in FIGS. 5B and 5C. The second polysilicon layer is then doped by the $POCl_3$ diffusion at 850° C. for 10 minutes, as shown in FIG. 5(B).

The semifinished product of polysilicon/silicon dioxide/silicon substrate obtained in FIG. 5(B) is immersed in a phosphoric acid solution containing 85% concentration of phosphoric acid at 140° C. for a predetermined period for the formation of the bottom polysilicon layer having a rugged surface, as shown in FIG. 5(C).

Thereafter, a stacked capacitor is formed by repeating the steps used to form the dielectric layer, the top polysilicon layer, the silicon dioxide insulation layer, the contact holes and the aluminum pads illustrated in FIGS. 4($c$)–4($h$).

Figure 6:
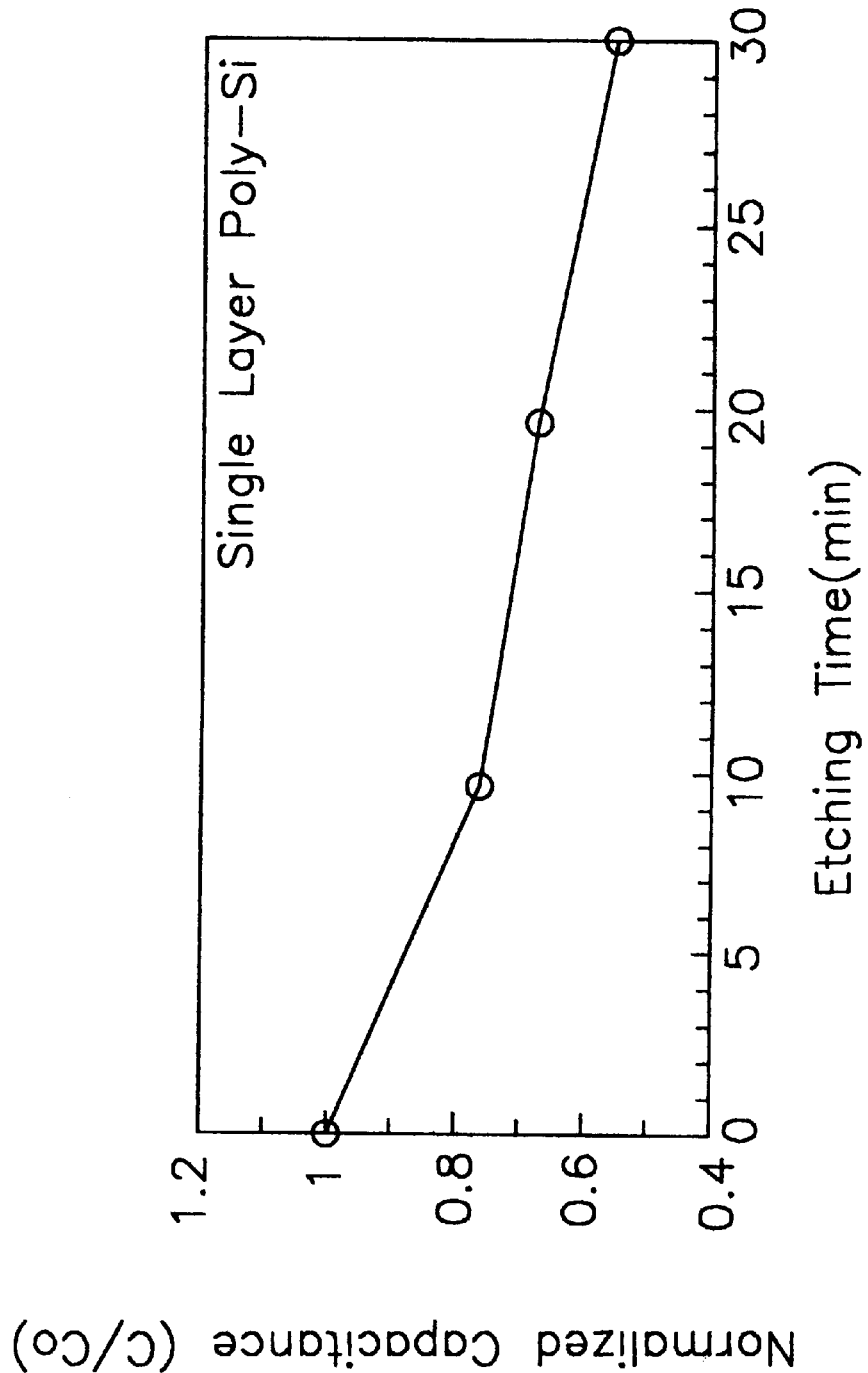
FIG. 6 is a plot showing the correlation between the phosphoric acid etching time and the normalized capacitance values of capacitors comprising a bottom electrode of a single-layered polysilicon.

A plot is presented in FIG. 6 for showing the correlation between the phosphoric acid etching time and the normalized capacitance values of capacitors comprising a bottom electrode of the single-layered polysilicon prepared in the comparing embodiment.

Figure 7:
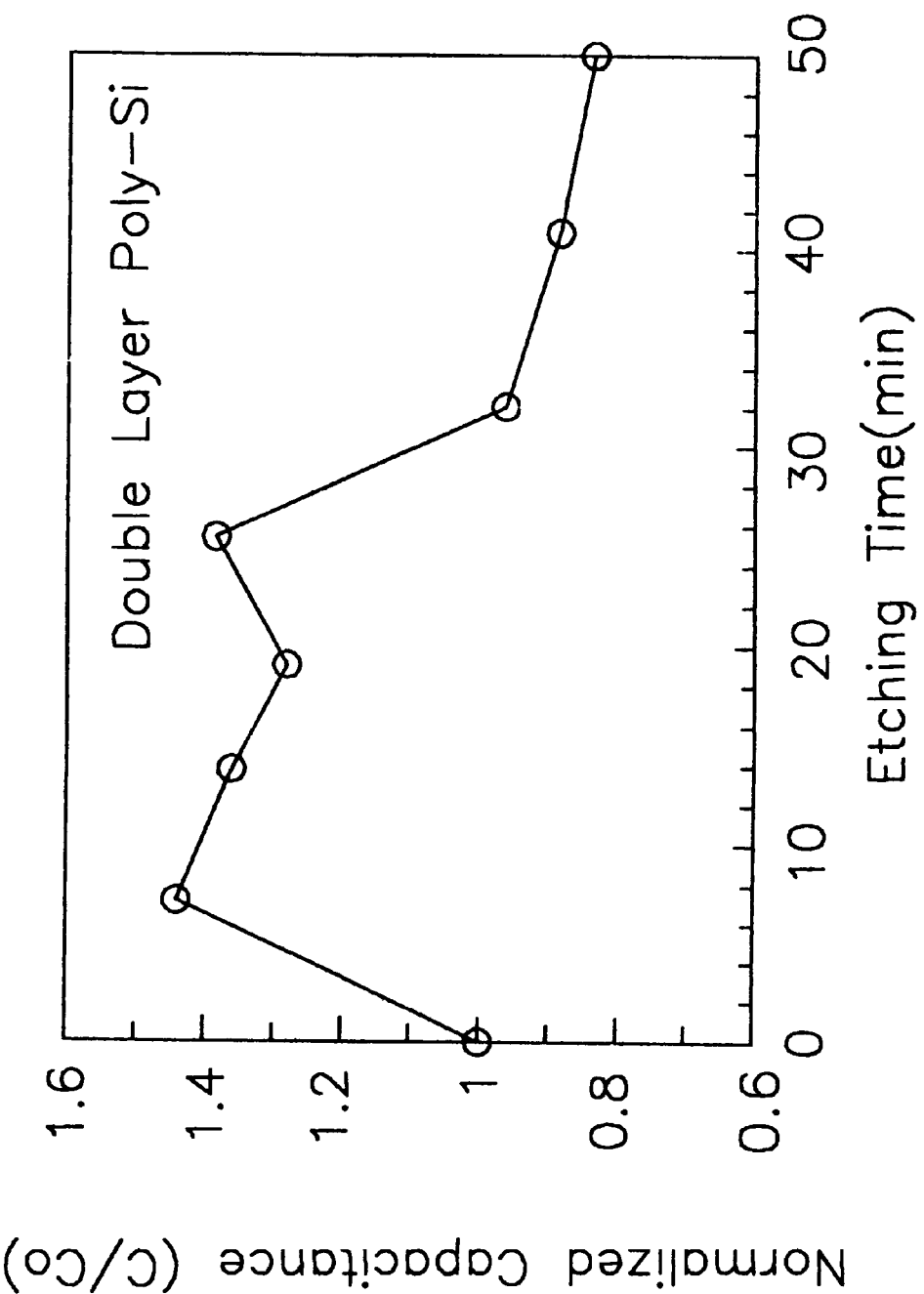
FIG. 7 is a graph showing the correlation between the phosphoric acid etching time and the capacitance values of capacitors comprising a bottom electrode of a double-layered polysilicon.

Another plot is shown in FIG. 7 for illustrating the correlation between the phosphoric acid etching time and the capacitance values of capacitors comprising a bottom electrode of the double-layered polysilicon prepared in the embodiment of the invention.

By comparing the implications of FIGS. 6 and 7, it becomes readily apparent that a stacked capacitor prepared by the method of the present invention making use of the double-layered polysilicon structure for forming the bottom electrode has a maximum capacitance which is more than 1.4 times greater than that of a stacked capacitor which is not treated with the phosphoric acid etching. On the other hand, as shown in FIG. 6, the maximum capacitance of a stacked capacitor having the bottom electrode formed by the single-layered polysilicon structure is never greater than that of a stacked capacitor which is not treated with the phosphoric acid etching.

The embodiment of the present invention described above is to be regarded in all respects as merely illustrative and not restrictive. Accordingly, the present invention may be embodied in other specific forms without deviating from the spirit thereof. The present invention is therefore to be limited only by the scopes of the following appended claims.

What is claimed is:

1. A method for forming a bottom polysilicon electrode of a stacked capacitor for DRAM, said stacked capacitor being formed on a silicon substrate and having a silicon dioxide layer, said bottom polysilicon electrode, a dielectric layer and a top polysilicon electrode, said method comprising the steps of:

(a) forming by deposition a first polysilicon layer on said silicon dioxide layer;

(b) doping impurity ions into said first polysilicon layer such that said first polysilicon layer becomes a doped first polysilicon layer;

(c) activating said impurity ions doped into said first polysilicon layer such that said doped first polysilicon layer becomes an activated and doped first polysilicon layer;

(d) following thereafter, forming by deposition a second polysilicon layer on said activated and doped first polysilicon layer whereby said second polysilicon layer is deposited directly and completely on said first polysilicon layer;

(e) doping impurity ions into said second polysilicon layer such that said second polysilicon layer becomes a doped second polysilicon layer;

(f) activating said impurity ions doped into said second polysilicon layer such that said doped second polysilicon layer becomes an activated and doped second polysilicon layer; and (g) etching with a phosphoric acid solution said activated and doped second polysilicon layer such that a rugged surface is formed on said activated and doped second polysilicon layer, while leaving said first polysilicon layer substantially unaffected by said etching.

2. The method as defined in claim 1, wherein said first polysilicon layer is formed by a low-pressure chemical vapor deposition; and wherein said first polysilicon layer has a thickness ranging between 500 and 2000 Å.

3. The method as defined in claim 1, wherein said second polysilicon layer is formed by a low-pressure chemical vapor deposition; and wherein said second polysilicon layer has a thickness ranging between 500 and 2000 Å.

4. The method as defined in claim 1, wherein said doping impurity ions into said first polysilicon layer referred to in the step (b) and said doping impurity ions into said second polysilicon layer referred to in the step (e) are carried out respectively by an ion implantation.

5. The method as defined in claim 1, wherein said ion implantation is brought about by using an ion selected from the group consisting of $P^+$, $As^+$, $Sb^+$ and $B^+$.

6. The method as defined in claim 1, wherein said activating said impurity ions doped into said first polysilicon layer referred to in the step (c) and said activating said impurity ions doped into said second polysilicon layer referred to in the step (f) are carried out respectively by a rapid thermal annealing (RTA), a conventional furnace annealing (CFA), or a combination of said rapid thermal annealing (RTA) and said conventional furnace annealing (CFA).

7. The method as defined in claim 1, wherein said doping impurity ions into said first polysilicon layer referred to in the step (b) and said activating said impurity ions doped into said first polysilicon layer referred to in the step (c) are carried out simultaneously by a phosphorus oxychloride ($POCl_3$) diffusion.

8. The method as defined in claim 1, wherein said doping impurity ions into said second polysilicon layer referred to in the step (e) and said activating said impurity ions doped into said second polysilicon layer referred to in the step (f) are carried out simultaneously by a phosphorus oxychloride ($POCl_3$) diffusion.

9. The method as defined in claim 1, wherein said phosphoric acid solution referred to in the step (g) contains 40–90% concentration of phosphoric acid; and wherein said activated and doped second polysilicon layer referred to in the step (g) is etched at a temperature ranging between 60 and 160° C. for a duration lasting between 3 and 150 minutes.

10. The method as defined in claim 9, wherein said activated and doped second polysilicon layer is etched for a period ranging between 3 and 30 minutes.

* * * * *